(12) United States Patent
Shindo et al.

(10) Patent No.: US 7,276,673 B2
(45) Date of Patent: Oct. 2, 2007

(54) SOLDER BONDING METHOD AND SOLDER BONDING DEVICE

(75) Inventors: Osamu Shindo, Tokyo (JP); Toru Mizuno, Tokyo (JP); Satoshi Yamaguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 56 days.

(21) Appl. No.: 10/947,294

(22) Filed: Sep. 23, 2004

(65) Prior Publication Data

US 2005/0067395 A1 Mar. 31, 2005

(30) Foreign Application Priority Data

Sep. 26, 2003 (JP) .............................. 2003-334729

(51) Int. Cl.
*B23K 26/00* (2006.01)
(52) U.S. Cl. .............................. 219/121.63; 219/121.64
(58) Field of Classification Search ........... 219/121.65, 219/121.66, 121.63, 121.64
See application file for complete search history.

(56) References Cited

U.S. PATENT DOCUMENTS

| | | | | |
|---|---|---|---|---|
| 4,149,062 A | * | 4/1979 | Limmer et al. | 219/121.68 |
| 4,215,823 A | * | 8/1980 | Wahl et al. | 239/553.3 |
| 4,358,112 A | * | 11/1982 | Straborny | 473/130 |
| 4,379,219 A | * | 4/1983 | Behrens et al. | 219/121.63 |
| 4,734,558 A | * | 3/1988 | Nakano et al. | 219/121.73 |
| 5,120,926 A | * | 6/1992 | Marriott | 219/121.67 |
| 5,758,992 A | * | 6/1998 | Sawallisch | 406/151 |
| 6,543,677 B2 | * | 4/2003 | Pattanaik et al. | 228/246 |
| 6,621,207 B2 | * | 9/2003 | Uda et al. | 313/485 |
| 6,634,545 B2 | * | 10/2003 | Razon et al. | 228/246 |
| 6,969,822 B2 | * | 11/2005 | Pollard | 219/121.84 |
| 2002/0103459 A1 | * | 8/2002 | Sparks et al. | 604/164.13 |

(Continued)

FOREIGN PATENT DOCUMENTS

JP 60-180666 9/1985

(Continued)

OTHER PUBLICATIONS

TDB-ACC-No. NNRD455102, "The top structure and process of Vacuum Pad for Solder Ball Locate & Laser Reflow (SBL2R) machine", IBM technical Disclosure Bulletin, Mar. 2002, UK, 1 page.*

*Primary Examiner*—Samuel M. Heinrich
(74) *Attorney, Agent, or Firm*—Oblon, Spivak, McClelland, Maier & Neustadt, P.C.

(57) ABSTRACT

A solder bonding method and a solder bonding device are provided, in which solder is melted, and heating of electrode portions is performed by irradiating laser light to an inner side of a region where electrodes portions are provided, making the temperature difference between the electrode portions and the melted solder smaller to improve the wettability of the solder and increase bonding reliability. The solder bonding method and the solder bonding device perform bonding of the electrode portions that are formed on an object to be bonded by melting the solder. After supplying the solder onto the electrode portions before melting, a laser is irradiated to the solder and to the electrode portions in the periphery of the solder. The solder melts, and the electrode portions are heated. The wettability of the solder with respect to the electrode portions thus improves, and the reliability of an electrical connection between the electrode portions can be increased.

8 Claims, 5 Drawing Sheets

U.S. PATENT DOCUMENTS

2003/0169980 A1* 9/2003 Yang .......................... 385/92
2005/0067385 A1* 3/2005 Carruthers et al. ...... 219/121.7
2005/0126472 A1* 6/2005 Popescu et al. ............. 117/200
2005/0237019 A1* 10/2005 Neumann et al. ........... 318/570

FOREIGN PATENT DOCUMENTS

| | | | | |
|---|---|---|---|---|
| JP | 362023003 | A | * | 1/1987 |
| JP | 362197240 | A | * | 8/1987 |
| JP | 401133672 | A | * | 5/1989 |
| JP | 401301955 | A | * | 12/1989 |
| JP | 406053694 | A | * | 2/1994 |
| JP | 6-41174 | | | 5/1994 |
| JP | 406244592 | A | * | 9/1994 |
| JP | 410006062 | A | * | 1/1998 |
| JP | 2002-076043 | | | 3/2002 |
| JP | 2003-204149 | | | 7/2003 |
| JP | 02003204149 | A | * | 7/2003 |

* cited by examiner

SOLDER BONDING METHOD AND SOLDER BONDING DEVICE

BACKGROUND OF THE INVENTION

1. Field of the Invention

The present invention relates to a solder bonding method and a solder bonding device. In particular, the present invention relates to a solder bonding method and a solder bonding device that are suited for making fine bonding, such as bonding between a bonding pad that is formed on a magnetic head slider and a pad that is formed on a lead frame side.

2. Related Background Art

A connection method is conventionally known, with which electrodes that are objects to be bonded are placed close to each other, the electrodes are made to contact ball-shaped solder (hereinafter called solder ball), and heat and ultrasonic vibration are applied to the solder ball (so-called ultrasonic pressure welding), thus making an electrical connection between the electrodes.

FIGS. 3A and 3B are diagrams of a first conventional example of a bonding device that makes connections between electrodes using a solder ball. FIG. 3A shows an approximate cross sectional view of the device, while FIG. 3B shows a laser profile (laser intensity distribution) in the device.

Referring to FIG. 3A, a nozzle 2 having a tapered shape is provided to a bonding device 1 in the first conventional example. A distal end of the nozzle 2 is made larger than at least the outer diameter of a solder ball 3, which is an object to be melted. It is thus possible to extract the solder ball 3 from the distal end side of the nozzle 2 after the solder ball 3 is sent into the nozzle 2. Further, a laser irradiation portion (not shown) is disposed in a rear end side of the nozzle 2. The solder ball 3 is held between the distal end of the nozzle 2 and an electrode portions 6 that is formed on each of a slider 4 and a flexure 5 which are objects to be bonded. The solder ball 3 can be melted by using laser light 7 emitted from the laser irradiation portion.

The arrangement of the bonding device is not limited to that described above, and different types of bonding devices are also known. FIGS. 4A and 4B show a second conventional example of a bonding device that makes connections between electrodes using a solder ball. FIG. 4A shows an approximate cross sectional view of the device, while FIG. 4B shows a laser profile (laser intensity distribution) 9 in the device.

It should be noted that, in the explanation provided here, identical reference numerals are used to denote members in the second conventional example which are common with those used in the first conventional example.

Referring to FIG. 4A, the nozzle 2 having a tapered distal end and the laser irradiation portion (not shown) disposed above the nozzle 2 are provided in a bonding device 8 of the second conventional example, similar to the first conventional example. However, a distal end opening of the nozzle 2 is formed having a smaller diameter than that of the solder ball 3, and suctioning means (not shown) is connected to an inner portion of the nozzle 2. Operating the suctioning means suctions the solder ball 3 from the distal end side of the nozzle 2, and it is thus possible to hold the solder ball 3 at the distal end of the nozzle 2.

In the bonding device 8 constructed as described above, after suctioning the solder ball 3 from a solder ball supplying device side (not shown), causing the solder ball 3 to move onto the electrode portions 6, the solder ball 3 is melted by using laser radiation, thus making a connection between the electrodes 6.

Incidentally, the following structures are known: a structure in which an optical beam is irradiated through a mask, thus irradiating only those locations where soldering is necessary (refer to Japanese Utility Model Application Laid-open No. 6-41174, for example); a structure in which a solder grains discharging process is performed before a process of irradiating a laser beam to the discharged solder grains and to electrodes (refer to JP 2002-76043 A, for example); and a structure in which a shield gas discharge opening is given a long, thin slit shape, and in which the optical axis of laser light is disposed within the shield gas discharge opening (refer to JP 2003-204149 A, for example).

However, the conventional methods described above have the problems shown below.

In the first conventional example, the solder ball must be extracted from the distal end of the nozzle. Consequently, the inner diameter of the distal end of the nozzle is set larger than the outer diameter of the solder ball. As shown in FIG. 3B, laser light (direct light or indirect light) therefore leaks out from a gap in the periphery of the solder ball, going beyond a region where the electrodes 6 are provided, when a laser is irradiated from the rear end side of the nozzle. Therefore there is a fear in that members in the periphery of the electrode portions 6 (such as polyimide that structures the flexure) may be damaged.

On the other hand, in the second conventional example, the diameter of the distal end of the nozzle example, the diameter of the distal end of the nozzle is set smaller than the outer diameter of the solder ball. Accordingly, it is possible to prevent damage to the members in the periphery of the electrode portions 6 caused by the laser, by irradiating the laser onto only the solder ball. However, no laser is irradiated to the electrode portions 6 (refer to the laser profile 9), and thus the temperature of the electrode portions 6 does not rise sufficiently. Consequently, the wettability of the melted solder ball worsens, and there is a fear that the reliability of the connection between the electrode portions 6 will decrease.

A variety of potential problems exist with connections made by using solder balls with the two bonding devices described above. A bonding device and a bonding method that make it possible to heat only an inner side of the region where the electrode portions 6 provided are therefore desired in order to increase the bonding reliability.

A device with which laser light is irradiated to an object by using a mask or the like is shown in the conventional techniques described above. However, neither of the techniques described above discloses a structure that reliably performs laser irradiation over an irradiation range inside the region where the electrode portions 6 is provided.

SUMMARY OF THE INVENTION

In view of the problems described above, an object of the present invention is to provide a solder bonding method and a solder bonding device with which laser is irradiated to an inner side of an a region where electrode portions are provided to thereby heat the electrode portions while heating solder at the same time, thus reducing a temperature difference between the electrode portions and the melted solder to increase bonding reliability due to improved wettability of the solder.

The present invention is based on the finding that it is possible to heat only the inner side of the electrode portions provided that a mask is disposed between a laser irradiation portion and an object to be irradiated, and an irradiation surface area regulated by the mask is made smaller than the surface area of the electrode portions.

That is, a solder bonding method according to the present invention relates to a solder bonding method for bonding electrode portions formed on an object to be bonded by melting solder onto the electrode portions, the solder bonding method including: supplying the solder onto the electrode portions; and melting the solder and heating the electrode portions by irradiating a laser light to the solder and to the electrode portions in a periphery of the solder, improving wettability of the solder with respect to the electrode portions.

It is preferable that the solder bonding method includes disposing a mask on an optical path of the laser light, the mask having a composite shape consisting of a hole shape having a surface area that is at least contained within a projected surface area of the solder, and a slit shape that cuts across the hole shape, wherein laser irradiation to the solder and to the electrode portions is performed through the mask.

More specifically, the present invention relates to a solder bonding method for bonding electrode portions formed on an object to be bonded by melting a solder ball onto the electrode portions, the solder bonding method including: transferring the solder ball onto the electrode portions by suctioning the solder ball by using a suction nozzle; and melting the solder ball and heating the electrode portions by irradiating a laser light to pass through a suction opening of the suction nozzle by using a laser irradiation portion disposed above the suction nozzle, the electrode portions being heated with laser light passing through an opening defined by the suction opening and an outer edge of the solder ball, improving the wettability of the solder with respect to the electrode portions.

Further, a solder bonding device according to the present invention relates to a solder bonding device including: a laser irradiation portion; and a mask disposed on an optical path of a laser light extending from the laser irradiation portion to the electrode portions that are formed on an object to be bonded, the solder bonding device bonding the electrode portions by melting solder provided on the electrode portions with the laser light passing through the mask, wherein the mask has a composite shape comprising a hole shape having a surface area that is contained within a projected surface area of the solder, and a slit shape that cuts across the hole shape, wherein the solder is melted by laser light passing through the hole shape, and wherein the electrode portions are heated by laser light passing through the slit shape.

More specifically, the present invention relates to a solder bonding device including at least: a suction nozzle having a suction opening which suctions a solder ball to transfer the solder ball to electrode portions formed on an object to be bonded; and a laser irradiation portion that is capable of irradiating a laser light through the suction opening of the suction nozzle, with the suction hole acting as a mask, wherein the mask has a composite shape comprising a hole shape having a smaller diameter than an outer diameter of the solder ball, and a slit shape that cuts across the hole shape, wherein the solder ball is melted by laser light passing through the hole shape, and wherein the electrode portions are heated by laser light passing through the slit shape. It is to be noted that, in the above arrangement, it is preferable that a DLC film be coated onto portions of the suction opening which contact the solder ball.

According to the present invention as explained above, in the solder bonding method in which solder is melted onto electrode portions, which are formed on the object to be bonded, to perform bonding of the electrode portions, the solder is supplied onto the electrode portions before being melted, and laser irradiation is then performed to the solder and to the electrode portions in the periphery of the solder, melting the solder and heating the electrode portions to improve the wettability of the solder with respect to the electrode portions. More specifically, in the solder ball bonding method for bonding the electrode portions by melting the solder ball onto the electrode portions formed on the object to be bonded, the solder ball is suctioned by the suction nozzle and transferred onto the electrode portions, and a laser is then irradiated by using the laser irradiation portion positioned above the suctioning nozzle so that the laser passes through the suction opening of the nozzle, thus melting the solder ball, and heating the electrode portions are heated by the laser that has passed through the opening defined by the suction opening of the suctioning nozzle and the outer edge portion of the solder ball, whereby the wettability of the solder with respect to the electrode portions improves. Therefore, heating of the electrode portions is performed by laser light irradiation to an inner side of a region where the electrode portions are provided, while melting the solder at the same time. The temperature difference between the electrode portions and the melted solder thus becomes smaller, thus improving the wettability of the solder to increase the bonding reliability. Further, by placing the coating of the DLC film on portions of the suction opening which contact the solder ball, it becomes possible to reduce the possibility of damage to the slider caused by static electricity while preventing the melted solder from adhering to the suctioning nozzle.

DESCRIPTION OF THE PREFERRED EMBODIMENTS

Figure 1A:
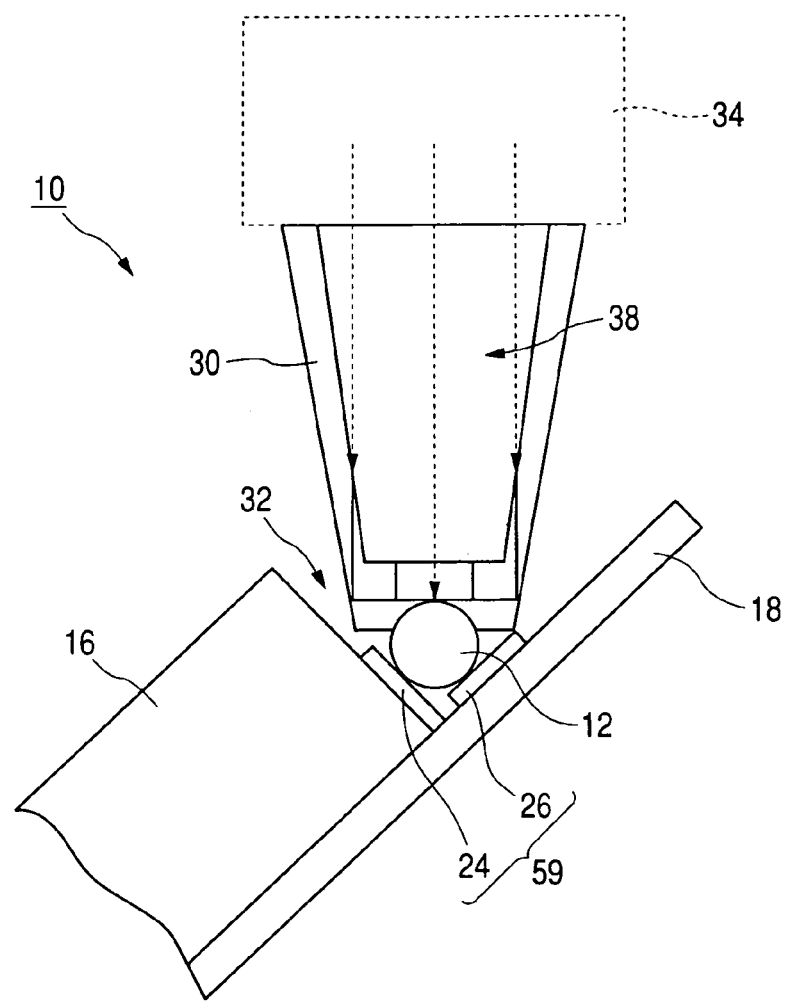
FIG. 1A is an explanatory diagram that shows a state in which a solder ball is melted on electrode portions by using a solder ball bonding device according to an embodiment of the present invention.

Preferred embodiments of a solder ball bonding method and a solder ball bonding device according to the present invention are explained in detail below while referring to the drawings. FIG. 1A is an explanatory diagram that shows a state in which a solder ball is melted on electrode portions by using a solder ball bonding device according to an embodiment of the present invention.

As shown in FIG. 1A, a solder ball bonding device 10 according to this embodiment can move reciprocally between a supplying device (not shown) that supplies a solder ball 12 and structural components (a slider 16 in which GMR elements and the like are embedded, and a flexure 18 that supports the slider 16) of a magnetic head that are objects to be bonded by use of moving means (not shown).

In this embodiment, there are provided a slider-side electrode 24 formed on the slider 16, and a flexure-side slider 26 arranged in correspondence with the electrode 24. The electrode 24 and the electrode 26 are disposed orthogonal to each other such that edges thereof are brought close and opposed to each other (that is, the electrode 24 and the electrode 26 form a V-shaped groove).

The bonding device 10 that moves reciprocally between the supplying device and the magnetic head is mainly composed of a conic barrel 30 that is a device main body, a suction nozzle 32 that is provided below the conic barrel 30, and a laser irradiation portion 34 that is disposed on a size opposite the suction nozzle 32 through the conic barrel 30.

A conjugate space 38 is formed in an inner portion of the conic barren 30. Feeding and exhausting means, and nitrogen gas supplying means that becomes inert gas supplying means are connected to the conjugate space 38 (both not shown). It is thus possible to perform suction from the suction nozzle 32 by reducing the pressure within the conjugate space, to release the conjugate space 38 from a reduced pressure environment to the ambient atmosphere (in other words, break a vacuum), or to feed nitrogen gas into the conjugate space 38 to inject the nitrogen gas from the suction nozzle.

Figure 1B:
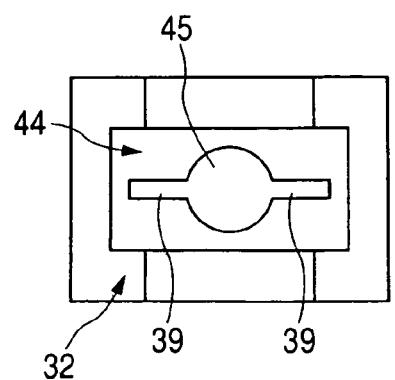
FIG. 1B is a diagram that shows the structure of a distal end of a suction nozzle that holds the solder ball in the solder ball bonding device according to the embodiment of the present invention.

Further, as shown in FIG. 1B, a suction opening 44 that communicates with the conjugate space is formed in a center portion of the suction nozzle 32 provided below the conic barrel 30.

The suction opening 44 has a composite shape made from a through hole 45 having a circular shape and having at least a smaller diameter than the outer diameter of the solder ball 12 so as to be able to suction the solder ball 12, and a slit shape 39 that cuts across the through hole 45. Further, the longitudinal direction of the slit shape 39 is set to coincide with the longitudinal direction of a target bonding portion formed by the slider side electrode 24 and the flexure side electrode 26. It is preferable that the shape of portions that project out from both sides of the through hole 45 due to the slit shape 39 be set to be laterally symmetric, with the through hole 45 taken as a center. It thus becomes possible for the amount of laser light irradiated through the projecting portions to be equal by making the projecting shapes of the slit identical on both sides of the through hole 45.

On the other hand, the laser irradiation portion 45 provided above the conic barrel 30 can irradiate laser light 50 through the suction opening 44 in the suction nozzle 32. It should be noted that the beam size of the laser light 50 is set in advance to a size that exceeds the diameter of the suction opening 44. The laser light emitted from the laser irradiation portion 34 thus coincides with the opening shape of the suction opening 44 after passing through the suction opening 44, which acts as a mask. Thus, based on laser light irradiation to the solder ball 12, it is possible to irradiate the laser light to the slider side electrode 24 and the flexure side electrode 26 through the opening defined by the outer edge of the solder ball 12 and the slit shape 39.

Procedures are explained next for bonding the slider side electrode 24 formed on the magnetic head slider 16 and the flexure side electrode 2-6 formed on the flexure 18 side by using the solder ball bonding device 10 configured as described above.

The solder ball 12 used to connect the slider side electrode 24 and the flexure side electrode 26 is a minute solder ball having an outer diameter on the order of 80 to 150 μm.

When performing bonding for this type of magnetic head, first, the bonding device 10 is moved to the solder ball supplying device side, and the solder ball 12 positioned in the supplying device 12 is suctioned by the suction nozzle 32, moving the solder ball 12 then to the suction nozzle 32 side. After then moving the bonding device to a solder bonding position, the feeding and exhausting means is operated, returning the inside of the conjugate space 38 to atmospheric pressure (breaking the vacuum). Nitrogen gas is then introduced within the conjugate space 38 by the nitrogen gas supplying means, and nitrogen gas is expelled from the suction nozzle 32.

The laser irradiation portion 34 is then operated while maintaining the state where nitrogen gas is being expelled from the suction nozzle 32, irradiating the laser light 50 toward the solder ball 12.

Figure 2A:
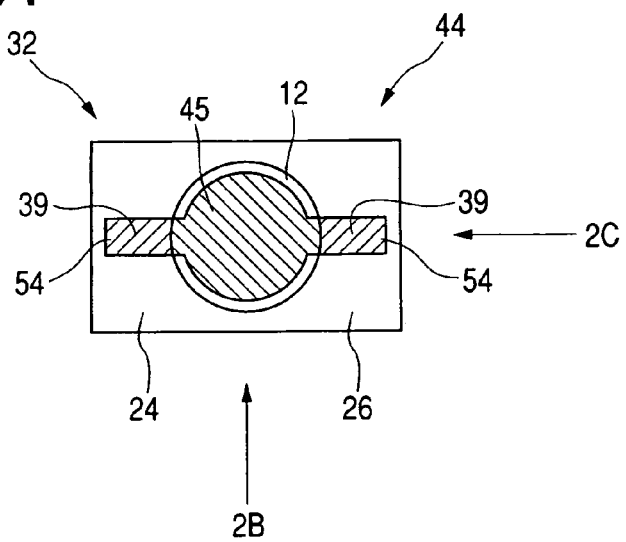
FIG. 2A is an explanatory diagram that shows relative positions between a suction opening, a solder ball, and electrode portions.
Figure 2B:
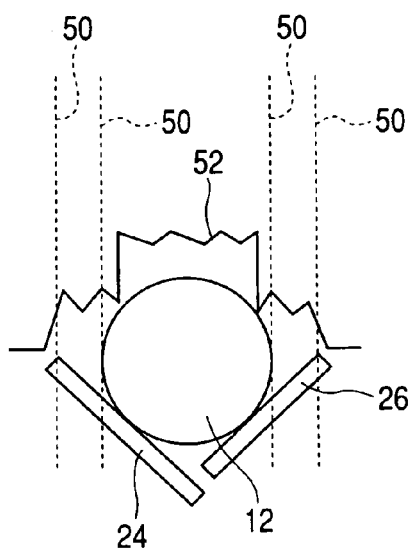
FIG. 2B is a diagram that shows a view as seen from the direction of an arrow 2B of FIG. 2A, with an overlapping laser profile 52.
Figure 2C:
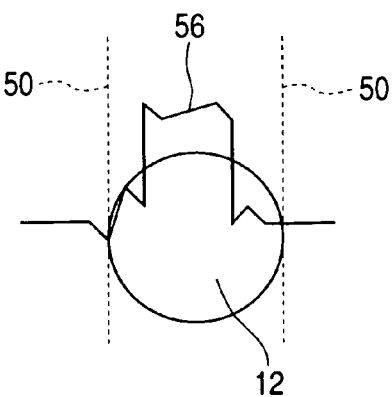
FIG. 2C is a diagram that shows a view as seen from the direction of an arrow 2C of FIG. 2A, with an overlapping laser profile 56.
Figure 3A:
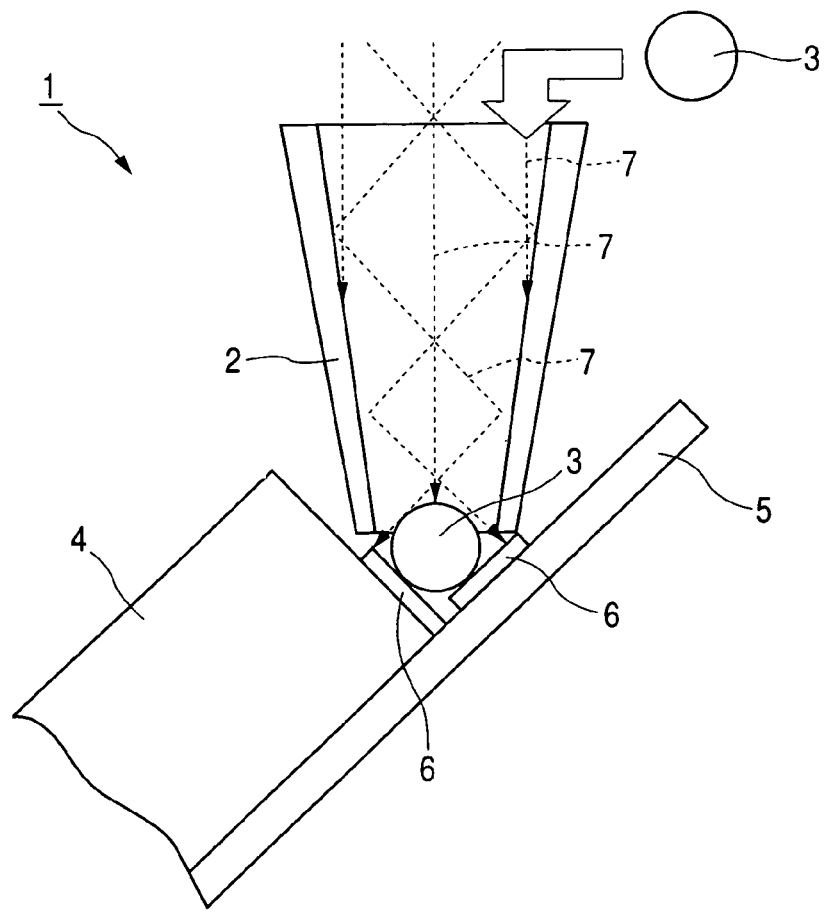
FIG. 3A is a diagram that shows an approximate cross section of a first conventional example of a bonding device that makes a connection between electrodes by using a solder ball.
Figure 3B:
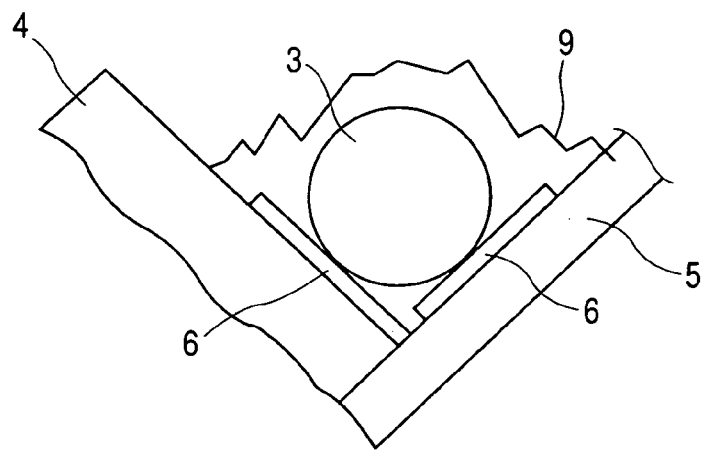
FIG. 3B is a diagram that shows a laser profile (laser intensity distribution) in the device shown in FIG. 3A.
Figure 4A:
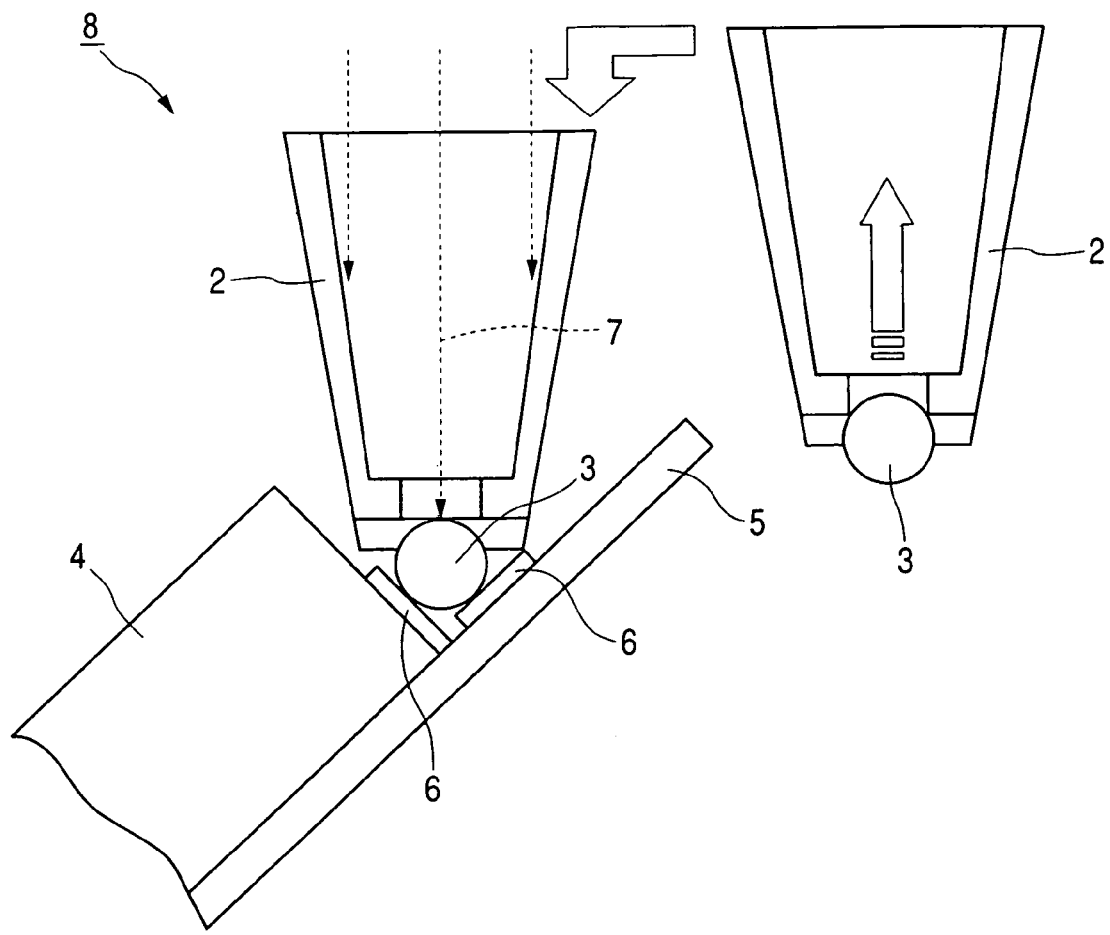
FIG. 4A is a diagram that shows an approximate cross section of a second conventional example of a bonding device that makes a connection between electrodes by using a solder ball.
Figure 4B:
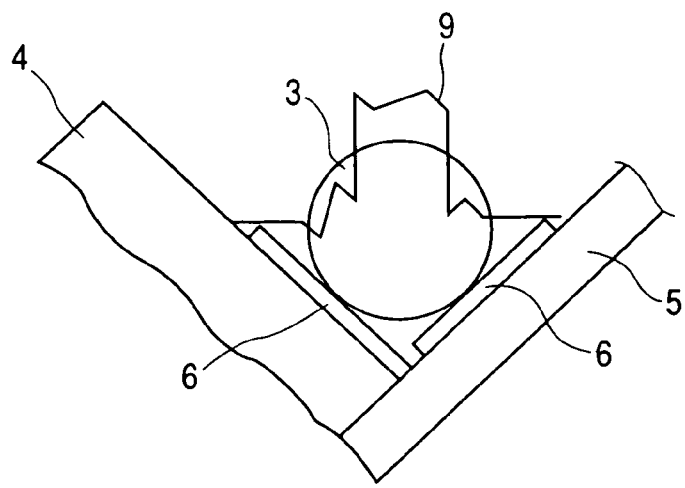
FIG. 4B is a diagram that shows a laser profile (laser intensity distribution) in the device shown in FIG. 4A.

FIGS. 2A to 2C are explanatory diagrams that show relative positions of the suction opening, the solder ball, and the electrode portions. As shown in FIG. 2A, the laser light 50 passing through the suction opening 44 is irradiated to the solder ball 12, and to regions in the slider side electrode 24 and the flexure side electrode 26 surrounded by the outer edge of the solder ball 12 and the slit shape 39 (the region corresponds to an opening portion 54 discussed later).

The solder ball 12 can be melted, and the slider side electrode 24 and the flexure side electrode 26 can be heated, by thus irradiating the laser light 50 to the solder ball 12 and to the slider side electrode 24 and the flexure side electrode 26 through the suction opening 44. In other words, the temperature difference between the slider side electrode 24 and the flexure side electrode 26 and melted solder (the melted solder ball 12) can be made smaller by heating the slider side electrode 24 and the flexure side electrode 26. The wettability of the solder can thus be improved. It thus becomes possible to improve the reliability of electrical connection in the electrode portion 59, namely the electrical connection between the slider side electrode 24 and the flexure side electrode 26.

It should be noted that the laser light 50 can be reliably prevented from being irradiated to the exterior beyond the slider side electrode 24 and the flexure side electrode 26, because the suction opening 44 is formed by combining the through hole 45, which has a round hole shape that corresponds to the shape of the solder ball 12, and the slit shape 39 that cuts across the through hole 45. FIG. 2B is a diagram that shows a view as seen in the direction of an arrow 2B in FIG. 2A, with an overlapping laser profile 52. As shown by the laser profile 52, the laser light 50 is only irradiated to a region inside the slider side electrode 24 and the flexure side electrode 26, and it can be understood that the laser light 50 is not irradiated to a region beyond the slider side electrode 24 and the flexure side electrode 26. Consequently, damage to polyimide positioned outside of the slider side electrode 24 and the flexure side electrode 26 due to laser irradiation can be prevented. Further, the width of the slit shape 39 that cuts across the through hole 45 may be set to one which at least allows suction of the solder ball 12, and may be suitably set according to conditions such as the amount of the laser light 50 to be irradiated to the electrodes 24, and slit machining requirements.

Further, as shown in FIG. 2B, with the objective of keeping the laser light 50 from going beyond the slider side electrode 24 and the flexure side electrode 26, it is preferable to utilize the wave motion characteristics of light and set the projection amounts of the slit shape to be laterally symmetrical with the through hole 45 taken as a center, for example. When the slit shape 39 has a laterally symmetrical configuration as described above, the laser lights 50 that are emitted from the left and right opening portions 54 interfere with each other, and are prevented from reaching a region outside of the slider side electrode 24 and the flexure side electrode 26.

FIG. 2C is a diagram that shows a view as seen in the direction of an arrow 2C in FIG. 2A, with an overlapping laser profile 56. The slit shape is not formed in the direction shown in FIG. 2C.

Accordingly, the laser light 50 is only irradiated to the solder ball 12. It thus becomes possible to prevent the laser light 50 from going beyond the slider side electrode 24 and the flexure side electrode 26, and being irradiated to a portion outside therefore, in this direction as well.

It should be noted that, although the explanation of this embodiment is made with the slit shape having a rectangular shape, the slit shape is not limited to this shape. A variety of shapes may be applied according to different conditions, such as design, provided that it is possible to irradiate laser light within the region of the slider side electrode 24 and the flexure side electrode 26. In addition, although the explanation in this embodiment is directed to the solder ball 12, which enables a connection between the slider 16 and the flexure 18 that constitute the magnetic head, the present invention is not limited to this. Other embodiments may also be used, provided that an electrical connection between different electrodes is made by using solder.

Further, this embodiment shows a preferred configuration in which the slit shape 39 cuts across the center portion of the through hole 45, and projects out evenly to portions on both sides of the through hold 45 taken as a center. This is because the center of the optical axis of the laser light 50 irradiated from the through hole 45 to the solder ball 12 substantially coincides with the center of the solder ball 12, and the slider side electrode 24 and the flexure side electrode 26 are disposed substantially symmetrically with respect to the center of the optical axis. However, a case can be considered in which, depending upon the structure of the target object, the center of the optical axis of the laser light 50 irradiated from the through hole 45 is shifted from the center of the solder ball 12 to one electrode portion side. A case can also be considered in which one of the electrode portions exists spaced at a greater distance from the center of the solder ball 12.

Figure 5A:
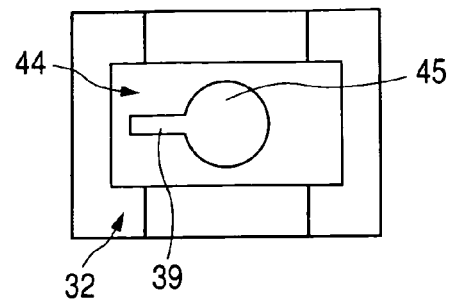
FIG. 5A is a diagram that shows a modification of the structure of the distal end of the suction nozzle that holds the solder ball in the solder ball bonding device according to the embodiment of the present invention.

In the above case, the amount of heat obtained through the solder ball 12 is large for the electrode portion that is disposed closer to the optical axis of the laser light 50 than the other electrode. The temperature difference between the electrode portion and the melted solder therefore becomes small, and it is likely that an electrical connection is ensured easily. It is therefore not particularly necessary to form a slit corresponding to the electrode portion. However, it is difficult for the electrode portion disposed at a greater distance from the optical axis of the laser light 50 to reach a sufficient temperature, and it may become difficult to make a reliable electrical connection. Accordingly, it is necessary to make the slit shape corresponding to the electrode portion wide or long, compared to that used in the embodiment described above, protruding out from the through hole. In other words, as shown in FIG. 5A, the shape of the suction nozzle 52 in such as case is a composite shape consisting of the through hole 45 and the slit shape 39 that is formed projecting out in a predetermined direction from the through hole 45. It should be noted that FIG. 5A shows the distal end portion of the nozzle in a similar form as in FIG. 1B. In other words, the effects of the present invention can be obtained provided that at least one slit shape 39 protrudes out from the hole 45. It should be noted that the through hole 45 described here acts as a primary pathway for obtaining the laser light emitted from a laser light source as laser light for soldering used in order to heat the solder.

Figure 5B:
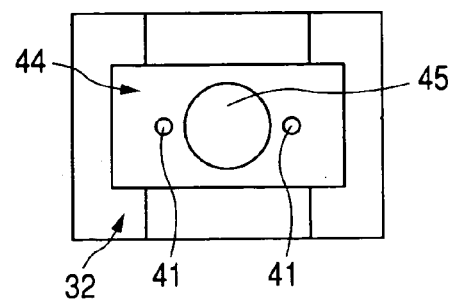
FIG. 5B is a diagram that shows another modification of the structure of the distal end of the suction nozzle that holds the solder ball in the solder ball bonding device according to the embodiment of the present invention.

Further, as shown in FIG. 5B, the slit shape 39 shown in FIG. 5A and the like may also be made from individual through holes 41. In other words, it suffices that the through hole and the slit shape used in the present invention secure a region for the laser light to pass through in order to heat only the solder ball, and a region for the laser light to pass through in order to heat only the electrode portions, respectively. The through hole is therefore not limited to a circular shape. There are no limitations placed on the shape of the through hole provided that the shape is one with which the solder ball can be suctioned and held, and the solder ball can be suitably heated. Further, it is possible to structure the slit shape by using a variety of shapes and number of openings, provided that it is possible with the slit shape to heat a desired portion inside the electrode portions by laser light. A single hole, a plurality of holes provided in a single electrode, and the like may be used. The slit shapes act as secondary pathways for separating out the laser light as electrode laser light used to heat the electrodes. It is preferable to form the main pathway described above as a through hole in order to hold the solder ball. Differing from the main pathway, however, it is not necessary for the secondary pathways to hold the solder balls. Transparent member such as glass may therefore be disposed in the secondary pathways, making it possible for only laser light to pass. It becomes possible to increase the sealing characteristics of the conjugate space 38, and improve the solder ball suction performance, by using this type of structure.

It should be noted that it is desirable in the present invention to substantially hold the solder ball 12 by the distal end portion of the suction nozzle 32, and perform connection operations between the solder ball 12 and the electrode portions 24 and 26 in this state. The solder ball 12 is thus prevented from falling off and the like during the connection operations. For example, when the through hole 45 and the slit shape 39 are formed in the distal end portion of the suction nozzle 32, and shaping of the laser light 50 is performed by passing it through the through hole 45 and the slit shape 39, it is necessary to pay attention to the possibility of the distal end portion of the suction nozzle 32 receiving laser light irradiation and being heated. In other words, there is also a fear that the distal end portion of the suction nozzle 32 will be heated by the laser light irradiation in addition to the solder ball 12. In this condition there is a possibility that the solder ball 12 in a melted state will also connect to the distal end portion of the suction nozzle 32 as well as to the electrode portions 24 and 26.

It is necessary to avoid the condition described above. Accordingly, a process is implemented which makes it hard for solder to bond to the distal end portion of the suction nozzle 32. Coating a material having poor wettability with respect to solder onto the distal end portion of the suction nozzle 32, more specifically portions thereof with which melted solder is liable to come into contact, can be considered as an easy and highly effective process. Coatings made from carbon materials are suitably used. Carbon materials generally have poor wettability with respect to melted metals, and further, are easily coated by using methods such as CVD and PVD. Furthermore, in addition to low wettability, a DLC film (diamond-like carbon film) having carbon as its main material has superior strength, superior anti-abrasion characteristics, and the like, and can easily be peeled off in a film-like manner. The possibility of melted solder adhering to the distal end portion of the suction nozzle 32 therefore decreases by coating the distal end portion 32 with a DLC film. In addition, even if there is some adherence of solder, the portions to which solder is adhering can be peeled off in a film-like manner by using stress or the like. As a result, solder adhesion can be effectively prevented.

Further, coating may also be performed on an inner portion of the through hole. There is a danger that melted solder will penetrate to the inside portion of the through hole when melting the solder ball with the suction nozzle contacting and holding the solder ball. Laser light is irradiated to the periphery of the through hole. Accordingly, the temperature of the periphery of the through hole also increases to a temperature substantially equal to the temperature of the melted solder. Consequently, there is also a possibility that the melted solder that has penetrated to the inner portion of the through hole will stick to the heated portions, clogging the through hole. It becomes possible to greatly reduce the possibility of clogging by coating the inner portion of the through hole with a DLC film.

Furthermore, the suction nozzle 32 is structured by an extremely hard alloy in this embodiment, for example. It is known that the suction nozzle and the solder ball will be easily charged with electricity when performing suctioning and transferring operations on the solder ball 12 by using the suction nozzle. When the charged members contact the electrodes or approach extremely close to the vicinity of the electrodes, electric charge will flow from the charged members to the slider 16. As a result, there is a fear that circuits formed on inner portions of the slider 16 will be damaged.

DLC films are known to have a high resistivity from $10^{-10}$ to $10^{-2}$ $\Omega$m. By coating a DLC film onto the distal end portion of the suction nozzle, the electrical resistances between the suction nozzle 32 and the solder ball 12 and the like increase, and the amount of electric current that flows from the suction nozzle 32 to the solder ball 12 and the like greatly decreases. Furthermore, the amount of static electricity that develops due to contact between the solder ball 12 and the suction nozzle 32 also decreases. By using the DLC film coating, it therefore becomes possible to greatly reduce the possibility of electrostatic damage (ESD) occurring during bonding operations.

Figure 6:
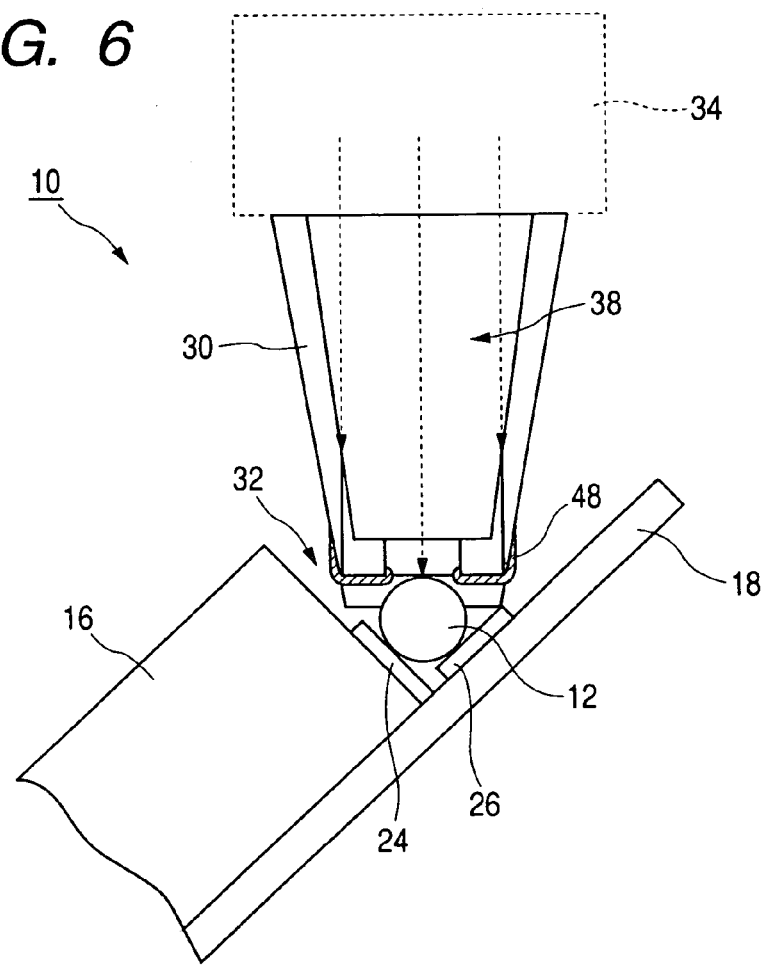
FIG. 6 is an explanatory diagram that shows a state in which a solder ball is melted on electrode portions by using a solder ball bonding device according to another embodiment of the present invention.

In view of the points described above, it is preferable in this embodiment of the present invention to coat regions of the suction nozzle that contact the solder ball by using a DLC film. FIG. 6 depicts, in the same manner as FIG. 1A, an embodiment of a bonding device of the present invention in which a DLC film is coated in the vicinity of the suction opening. It should be noted that, while the coating is only performed on the distal end surfaces of the suction nozzle in FIG. 6, it is preferable to also coat regions which may come into contact with the solder ball, members that support the solder ball, and the like with a DLC film.

It should be noted that, in other words, the present invention relates to a device and a method in with which a solder ball is placed between a first electrode formed on a slider, and a second electrode formed on a flexure, and the electrodes are bonded together by melting the solder ball. Therefore, a main characteristic feature of the present invention is obtaining laser light that is guided to the solder ball and laser light that is guided to desired positions on the electrodes, from laser light that is emitted by a light source (not shown) by means of a member arranged on the optical path of the laser light. In other words, a primary pathway for obtaining the laser light used for the solder ball and secondary pathways for obtaining the laser light used for the electrodes may be formed.

In this embodiment, the primary pathway is configured as the through hole in the distal end portion of the nozzle, having a shape that can be disposed within a projected shape of the solder ball. Further, the secondary pathways are configured as slit shapes, or through holes, in the periphery of the through hole serving as the primary pathway in the distal end portion of the nozzle. The through holes or the like may be disposed in the distal end portion of the suction nozzle in this embodiment. The through holes or the like may also be disposed in positions other than the distal end portion of the nozzle, such as on an optical pathway of the laser light, serving as a mask for regulating the irradiation shape of the laser light. Furthermore, the primary pathway is for forming laser light used to heat the solder ball, and consists of a hole through which the laser light for the solder ball passes. It is preferable that the cross sectional shape of the hole, as taken along a plane orthogonal to the optical axis of the laser light used for the solder ball, be contained inside the shape of the solder ball as projected on the plane. Furthermore, it is preferable to coat a DLC film up through an inner circumferential surface of the through hole serving as the primary pathway. At minimum, it is preferable to coat a DLC film onto surfaces of a plate-like member on the solder ball side.

This application claims priority from Japanese Patent Application No. 2003-334729 filed Sep. 26, 2003, which is hereby incorporated by reference herein.

What is claimed is:

1. A solder bonding method for bonding electrode portions formed on an object to be bonded by melting a solder ball onto the electrode portions, the solder bonding method comprising:

transferring the solder ball onto a prescribed position to be bonded to the electrode portions by suctioning the solder ball at a suction opening of a suction nozzle, wherein the suction opening doubles as a primary pathway of a laser light irradiation path and as a secondary pathway of a laser light irradiation path located around the primary pathway; and melting the solder ball by irradiating a laser light generated at a laser irradiation portion passing through the primary pathway, and heating at least one of the electrode portions by irradiating a laser light generated at the laser irradiation portion passing through the secondary pathway.

2. A solder bonding device comprising:

a suction nozzle having a suction opening configured to suction a solder ball to transfer the solder ball to electrode portions formed on an object to be bonded; and a laser irradiation portion that is configured to irradiate laser light, wherein the suction opening acts as a primary pathway through which a part of the laser light irradiated onto the solder ball and melting the solder ball passes, and the suction nozzle further has a secondary pathway located around the primary pathway, through which a part of the laser light irradiated onto at least one of the electrode portions and heating the at least one of the electrode portions passes.

3. A solder bonding device according to claim 2, wherein the secondary pathway is formed to connect with the suction opening and has a slit shape.

4. A solder bonding device according to claim 2, wherein the primary pathway has a through hole shape, and the secondary pathway is arranged about a periphery of the primary pathway and is formed to a through hole shape.

5. A solder bonding device according to claim 2, wherein the suction nozzle has a DLC film coated portion on at least an area contacting with the solder ball.

6. A solder bonding device for bonding a first electrode and a second electrode by placing a solder ball between the first electrode and the second electrode, and melting the solder ball by using laser light, the solder bonding device comprising:

a laser irradiation portion configured to irradiate laser light;

a primary pathway configured to allow a part of the laser light to pass therethrough as a primary laser light to irradiate onto the solder ball so as to melt the solder ball; and a secondary pathway located around the primary pathway, and configured to allow a part of the laser light to pass therethrough as a secondary laser light to make an area to be irradiated by the secondary laser light smaller than an area of the first electrode or the second electrode and to irradiate the secondary laser light onto at least one of the first electrode and the second electrode so as to heat at least one of the first electrode and the second electrode.

7. A solder bonding device according to claim 6, wherein the secondary pathway is formed to connect with the suction opening and has a slit shape.

8. A solder bonding device according to claim 6, wherein the primary pathway has a through hole shape, and the secondary pathway is arranged about a periphery of the primary pathway and is formed to a through hole shape.

* * * * *